United States Patent
Suuronen et al.

(10) Patent No.: US 9,692,325 B2
(45) Date of Patent: Jun. 27, 2017

(54) HIGH CONDUCTIVITY ELECTROSTATIC CHUCK

(75) Inventors: David Suuronen, Newburyport, MA (US); Lyudmila Stone, Lynnfield, MA (US); Julian Blake, Gloucester, MA (US); Dale K. Stone, Lynnfield, MA (US); Richard A. Cooke, Framingham, MA (US); Steven Donnell, Burlington, MA (US); Chandra Venkatraman, Tyngsboro, MA (US)

(73) Assignees: Entegris, Inc., Billerica, MA (US); Varian Semiconductor Equipment Associates, Inc., Gloucester, MA (US)

(*) Notice: Subject to any disclaimer, the term of this patent is extended or adjusted under 35 U.S.C. 154(b) by 164 days.

(21) Appl. No.: 13/818,339

(22) PCT Filed: Sep. 8, 2011

(86) PCT No.: PCT/US2011/050841
§ 371 (c)(1),
(2), (4) Date: Feb. 22, 2013

(87) PCT Pub. No.: WO2012/033922
PCT Pub. Date: Mar. 15, 2012

(65) Prior Publication Data
US 2013/0155569 A1    Jun. 20, 2013

Related U.S. Application Data

(60) Provisional application No. 61/380,970, filed on Sep. 8, 2010, provisional application No. 61/509,970, filed on Jul. 20, 2011.

(51) Int. Cl.
*H01L 21/683* (2006.01)
*H02N 13/00* (2006.01)
*B23Q 3/152* (2006.01)

(52) U.S. Cl.
CPC .......... *H02N 13/00* (2013.01); *B23Q 3/152* (2013.01); *H01L 21/6831* (2013.01); *H01L 21/6833* (2013.01)

(58) Field of Classification Search
CPC ...... H01L 21/6831; H01L 21/33; H02N 13/00
(Continued)

(56) References Cited

U.S. PATENT DOCUMENTS 5,452,177 A    9/1995 Frutiger
6,117,246 A    9/2000 Parkhe et al.
(Continued)

FOREIGN PATENT DOCUMENTS

CN    1638084 A    7/2005
CN    1674247 A    9/2005
(Continued)

OTHER PUBLICATIONS

International Preliminary Report on Patentability, PCT/US2011/050841, filed Sep. 8, 2011, Title: High Conductivity Electrostatic Chuck, date of mailing Dec. 7, 2012.
(Continued)

*Primary Examiner* — Ronald W Leja
(74) *Attorney, Agent, or Firm* — Hamilton, Brook, Smith & Reynolds, P.C.

(57) ABSTRACT

In accordance with an embodiment of the invention, there is provided an electrostatic chuck comprising a conductive path covering at least a portion of a workpiece-contacting surface of a gas seal ring of the electrostatic chuck, the conductive path comprising at least a portion of an electrical path to ground; and a main field area of a workpiece-contacting surface of the electrostatic chuck comprising a surface resistivity in the range of from about $10^8$ to about $10^{12}$ ohms per square.

25 Claims, 8 Drawing Sheets

(58) Field of Classification Search
USPC .......................................................... 361/234
See application file for complete search history.

(56) References Cited

U.S. PATENT DOCUMENTS

| | | | |
|---|---|---|---|
| 6,370,007 | B2 | 4/2002 | Takahasi et al. |
| 6,388,861 | B1 | 5/2002 | Frutiger |
| 7,623,334 | B2 | 11/2009 | Mizuno et al. |
| 7,821,767 | B2 * | 10/2010 | Fujii .................. H01L 21/6833 361/234 |
| 8,169,768 | B1 * | 5/2012 | Tahmassebpur et al. ..... 361/234 |
| 2005/0099758 | A1 * | 5/2005 | Kellerman .......... H01L 21/6833 361/234 |
| 2006/0005930 | A1 | 1/2006 | Ikeda et al. |
| 2006/0158823 | A1 | 7/2006 | Mizuno et al. |
| 2007/0111542 | A1 | 5/2007 | Shinozaki et al. |
| 2009/0142599 | A1 * | 6/2009 | Dekempeneer et al. ..... 428/408 |
| 2009/0284894 | A1 | 11/2009 | Cooke |
| 2010/0265631 | A1 * | 10/2010 | Stone et al. .................. 361/234 |
| 2011/0026187 | A1 * | 2/2011 | Reynolds ...................... 361/234 |
| 2013/0120897 | A1 * | 5/2013 | Lin ........................ H02N 13/00 361/234 |
| 2013/0155569 | A1 * | 6/2013 | Suuronen ............... B23Q 3/152 361/234 |

FOREIGN PATENT DOCUMENTS

| | | |
|---|---|---|
| EP | 1391786 A1 | 2/2004 |
| JP | 2 015 735 U | 1/1990 |
| JP | 05 063 063 A | 3/1993 |
| JP | 8 316 298 A | 11/1996 |
| JP | 2004/349663 A | 12/2004 |
| JP | 2005005001 A * | 1/2005 |
| JP | 2006/040993 A | 2/2006 |
| JP | 2008/135 736 A | 6/2008 |
| JP | 2008/210913 A | 9/2008 |
| JP | 2008/251737 A | 10/2008 |
| TW | 2009/26349 A1 | 6/2009 |
| TW | 2010/15657 A1 | 4/2010 |
| WO | WO 2009/031566 A | 3/2009 |
| WO | WO 2010/132640 A2 | 11/2010 |

OTHER PUBLICATIONS

Written Opinion, PCT/US2011/050841, filed Sep. 8, 2011, Title: High Conductivity Electrostatic Chuck, date of mailing Apr. 9, 2012.

International Search Report, PCT/US2011/050841, filed Sep. 8, 2011, Title: High Conductivity Electrostatic Chuck, date of mailing Apr. 9, 2012.

* cited by examiner

HIGH CONDUCTIVITY ELECTROSTATIC CHUCK

RELATED APPLICATIONS

This application is the U.S. National Stage of International Application No. PCT/US2011/050841, filed Sep. 8, 2011, which designates the U.S., published in English, and claims the benefit of U.S. Provisional Application No. 61/380,970, filed on Sep. 8, 2010, and claims the benefit of U.S. Provisional Application No. 61/509,970, filed on Jul. 20, 2011. The entire teachings of the above applications are incorporated herein by reference.

BACKGROUND OF THE INVENTION

Electrostatic chucks, also known as platens, are used to secure and support a workpiece for processing. Electrostatic charge may accumulate on the workpiece and also on the platen surface supporting the workpiece. Charge accumulated on the workpiece can be transferred to the platen surface, and charge accumulated on the platen surface can be transferred to the workpiece.

Charge accumulation can cause workpiece "sticking" problems. In one instance, the charge accumulation can be so great that typical unclamping forces can not release the workpiece. For example, a typical unclamping force may be provided by raising lift pins to contact the backside of the workpiece. In another instance, the lift pins may be able to lift a portion of the workpiece but a remaining portion remains in contact with the workpiece. When the workpiece is a disk shaped semiconductor wafer, the wafer may become "tilted" appearing stuck to an edge of the platen. When an associated robot arm attempts to retrieve the wafer, it may not properly engage the wafer and even push the wafer off the platen leading to possible wafer damage and interruptions in processing. Another workpiece "sticking" problem may be referred to as "dancing around the platen." In this instance, the workpiece may be clamped to the platen during processing or in a load position. With some circular or disk shaped workpieces such as a semiconductor wafer, the wafer may enter into a general oscillatory precession around the outer circumference of the platen creating great risk for dropping of the wafer. In other cases, "wafer walk" may occur, which may be caused by partial sticking of the wafer edge to the platen during lifting, resulting in a wobble of the wafer on the lift pins and possible misalignment on the pins leading to a wafer handling problem.

Even if charge accumulation does not lead to workpiece "sticking" problems, it may lead to damage of devices being formed on the workpiece. In a plasma doping ion implanter where the workpiece is positioned in the same chamber as plasma, excessive charge accumulation can also lead to doping non-uniformities, micro-loading, and arcing. Hence, the throughput of the plasma doping ion implanter may be intentionally limited in some instances to avoid excessive charge accumulation.

One conventional solution to controlling charge accumulation uses three spring loaded grounding pins that contact a backside of the workpiece to provide a path to ground when the workpiece is in a clamped position. One drawback of this solution is that the spring loaded grounding pins are limited to three pins. As such, the effectiveness of this grounding arrangement to dissipate excessive charge build up is limited. Another drawback of this solution is that the contact points of the spring loaded grounding pins have sharp edges that can cause damage to the backside of the workpiece. Damage to the backside of the workpiece can also generate unwanted particles (contamination) which may be critical to limit in some processing applications.

Accordingly, there is an ongoing need to improve the performance of electrostatic chucks.

SUMMARY OF THE INVENTION

In accordance with an embodiment of the invention, there is provided an electrostatic chuck comprising a conductive path covering at least a portion of a workpiece-contacting surface of a gas seal ring of the electrostatic chuck, the conductive path comprising at least a portion of an electrical path to ground; and a main field area of a workpiece-contacting surface of the electrostatic chuck comprising a surface resistivity in the range of from about $10^8$ to about $10^{12}$ ohms per square.

In further, related embodiments, the conductive path may comprise a surface resistivity of less than about $10^7$ ohms per square, such as a surface resistivity in the range of from about $10^5$ ohms per square to about $10^7$ ohms per square. The conductive path may comprise diamond-like carbon, such as doped diamond-like carbon, for example hydrogenated carbon doped with nitrogen. The conductive path may comprise a coating of a thickness less than about 1 micron. The conductive path may comprise a coating covering at least a portion of an outside edge of the electrostatic chuck. The conductive path may wrap underneath an insulator layer of the electrostatic chuck. The main field area may comprise silicon carbide, and may comprise a surface resistivity in the range of from about $10^9$ to about $10^{11}$ ohms per square.

In other related embodiments, the electrostatic chuck may comprise a conductive grounding layer, at least a portion of which is underneath an insulator layer of the electrostatic chuck, the conductive grounding layer electrically contacting the conductive path. The conductive grounding layer may comprise a surface resistivity of less than about $10^3$ ohms per square, and may comprise aluminum. At least a portion of the outside edge of the conductive grounding layer may be covered by the conductive path. The conductive grounding layer may electrically contact a grounding pin of the electrostatic chuck. The electrostatic chuck may further comprise an electrically conductive epoxy layer underlying at least a portion of the conductive grounding layer.

In further related embodiments, the main field area may comprise at least one embossment extending above surrounding portions of the main field area. The electrostatic chuck may further comprise a conductive coating on a workpiece-contacting surface of the at least one embossment. The conductive path of the electrostatic chuck and the conductive coating on the workpiece-contacting surface of the at least one embossment may each comprise a diamond like carbon coating. The electrostatic chuck with the at least one embossment may comprise a conductive grounding layer, at least a portion of which is underneath an insulator layer of the electrostatic chuck, the conductive grounding layer electrically contacting the conductive path. A base of the electrostatic chuck may comprise a chamfered area on one or more edges of the base. The conductive path may electrically contact the base through an electrically conductive epoxy in the chamfered area, such as a graphite conductive epoxy. The conductive path may comprise a coating covering at least a portion of an outside edge of the electrostatic chuck, the conductive path wrapping underneath an insulator layer of the electrostatic chuck.

In other related embodiments, the electrostatic chuck may further comprise a conductive pattern on the workpiece-contacting surface of the electrostatic chuck, the at least one conductive pattern electrically contacting the conductive path. The at least one conductive pattern may comprise a metal coated with a conductive coating, such as aluminum coated with diamond like carbon. The at least one conductive pattern may comprise at least one of: a spoke extending towards the center of the electrostatic chuck; a ring around a gas hole of the electrostatic chuck; and a trace between at least one embossment on the workpiece-contacting surface of the electrostatic chuck.

In further related embodiments, the main field area of the electrostatic chuck may comprise a polymer. The main field area may comprise at least one embossment extending above surrounding portions of the main field area, the at least one embossment comprising a polymer. The main field area may comprise a surface resistivity in the range of from about $10^8$ to about $10^{10}$ ohms per square. The polymer may comprise at least one of: polyether imide; polyether ether ketone; and polyimide. The conductive path of the electrostatic chuck comprising a polymer main field area may comprise a diamond like carbon coating over at least a portion of an outside edge of the electrostatic chuck, and the electrostatic chuck may further comprise an aluminum grounding coating under at least a portion of an insulating layer of the electrostatic chuck, the aluminum coating electrically contacting the conductive path. The conductive path of the electrostatic chuck comprising a polymer main field area may comprise a conductive coating covering at least a portion of the main field area. For example, the conductive coating may comprise diamond like carbon covering at least a portion of the main field area and at least a portion of the gas seal ring, and the electrostatic chuck may further comprise an aluminum grounding coating under at least a portion of an insulating layer of the electrostatic chuck, the aluminum coating electrically contacting the conductive path. The conductive path may comprise doped silicon carbide.

In another embodiment according to the invention, there is provided an electrostatic chuck comprising a conductive path electrically connected to at least a portion of a workpiece-contacting surface of the electrostatic chuck, the conductive path comprising at least a portion of an electrical path to ground; and a main field area of a workpiece-contacting surface of the electrostatic chuck comprising a surface resistivity in the range of from about $10^8$ to about $10^{10}$ ohms per square, the main field area comprising a polymer comprising carbon nanotubes. For example, the polymer may comprise at least one of: carbon nanotube filled polyether imide; carbon nanotube filled polyether ether ketone; and carbon nanotube filled polyimide.

In accordance with an embodiment of the invention, the conductive path covering at least a portion of a workpiece-contacting surface of a gas seal ring of the electrostatic chuck, which conductive path comprises at least a portion of an electrical path to ground, also maintains the gas sealing properties of the gas seal ring.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention. In addition, it should be understood that, where components are shown adjacent to each other, they may make electrical contact with each other even though they are shown with some small amount of space between them in the drawings for purposes of clarity, as will be apparent from context in the description herein with reference to the drawings.

DETAILED DESCRIPTION OF THE INVENTION

A description of example embodiments of the invention follows.

In some conventional electrostatic chucks, after numerous workpiece clamping cycles, the top surface may break down, thereby creating "islands." Between these "islands", the material cross sectional area may be decreased, restricting the distribution of electrical charge throughout the top doped layer. Subsequently, this creates "islands of electrical charge" where the charge polarity can be observed to reverse over several millimeters. A change of +/−400V or more over a 4-6 millimeter distance is not uncommon. This localized surface charge may lead to unintended wafer clamping even in the absence of external electrical voltage.

Accordingly, there is a need for an improved platen to control charge accumulation in electrostatic chucks.

Figure 1:
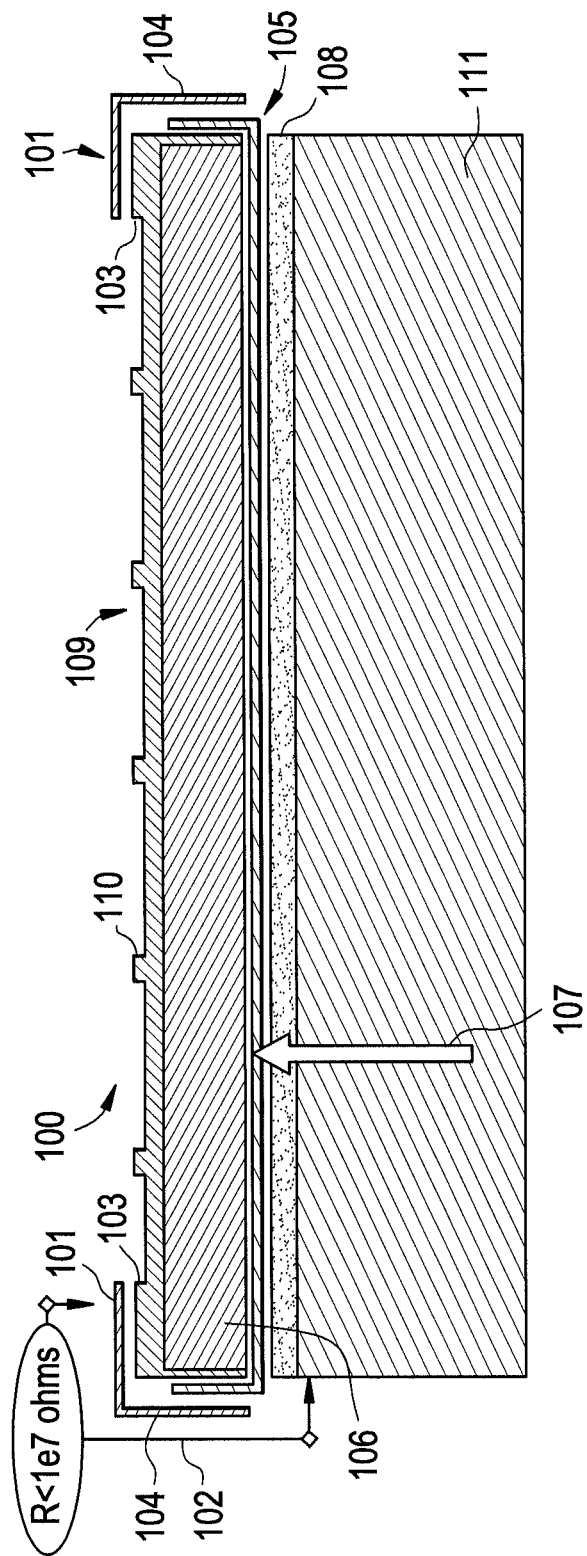
FIG. 1 is a diagram of an electrostatic chuck in accordance with an embodiment of the invention.

FIG. 1 is a diagram of an electrostatic chuck 100 in accordance with an embodiment of the invention. The electrostatic chuck 100 features a conductive path to ground 101, which permits discharge of excessive surface charge to ground, thereby reducing wafer sticking due to surface charge collection. A benefit of the embodiment of FIG. 1 is that by using the carefully chosen surface resistivities and grounding paths set forth herein, surface charge can be neutralized without adversely affecting clamping force. The conductive path 101 may, for example, be made of diamond-like carbon (DLC), which may be doped to achieve an appropriate surface resistivity. For example, the conductive coating 101 may have a surface resistivity of less than about $10^7$ ohms per square, measured as shown at 102 between the DLC coating and ground, for example a surface resistivity of between about $10^5$ ohms per square and about $10^7$ ohms per square. The conductive path 101 may, for example, be made of a film of hydrogenated carbon doped with nitrogen, of a thickness of about 1 micron. The conductive path 101 may be a conductive coating that covers over the gas seal ring 103 around the edge of the chuck, and wraps down the side of the chuck as at 104. In addition, a conductive grounding layer 105, such as a layer of sputtered aluminum or other metal, may be positioned under the ceramic layer 106 of the chuck, and may be covered by the conductive path 101 around the edge of the chuck. The conductive grounding layer 105 may be prevented from contacting the substrate (or other workpiece) by being covered with the conductive path 101, which may for example be a DLC coating. The conductive grounding layer 105 contacts ground, for example, using a grounding pin 107 and/or an underlying layer of electrically conductive epoxy 108. The conductive grounding layer 105 may, for example, be an aluminum layer about 0.5 microns thick. The main field area 109 of the chuck surface may be a silicon carbide surface with embossments 110 that extend above surrounding areas of the main field area 109. The surface resistivity between the main field area 109 and ground may be in the range of from about $10^8$ to about $10^{12}$ ohms per square, for example in the range of $10^{10}$ ohms per square, while the surface resistivity between the conductive path 101 and ground is about $10^7$ ohms per square. A lower surface resistivity between the conductive path 101 and ground is probably not detrimental, as long as the conductive path 101 only extends a short distance onto the workpiece-contacting surface of the electrostatic chuck. The electrostatic chuck 100 also includes a base 111, for example made of aluminum. The conductive path 101, such as a DLC coating, may cover the gas seal ring 103 and extend around the edge of the platen to cover the side of the ceramic assembly, as at 104. Further electrical contact may be made using electrically conductive graphite epoxy in the outside edge of the electrostatic chuck 100. A surface resistivity of about $5 \times 10^5$ ohms per square from the gas seal ring 103 (inside the conductive path 101) to ground may be used. The electrostatic chuck may further include gas holes, lift pins, and other standard components (not shown).

In accordance with the embodiment of FIG. 1, the conductive path 101, such as a coating of diamond like carbon, may be at or near the edge of the electrostatic chuck 100 in order to make contact with workpiece, such as a semiconductor wafer, on the gas seal ring 103. The surface resistivity from the center of the electrostatic chuck 100 to ground may be less than about $10^{11}$ ohms per square, in order to achieve as much charge mobility as possible. A low surface resistivity material, such as silicon carbide, may be used for the main field area 109, in order to achieve good charge mobility from the center of the electrostatic chuck to the edge. An embodiment according to FIG. 1 with conductive path 101 has a minimal impact on gas leaks or clamp force of the electrostatic chuck, and has good wear resistance and robustness.

Figure 2:
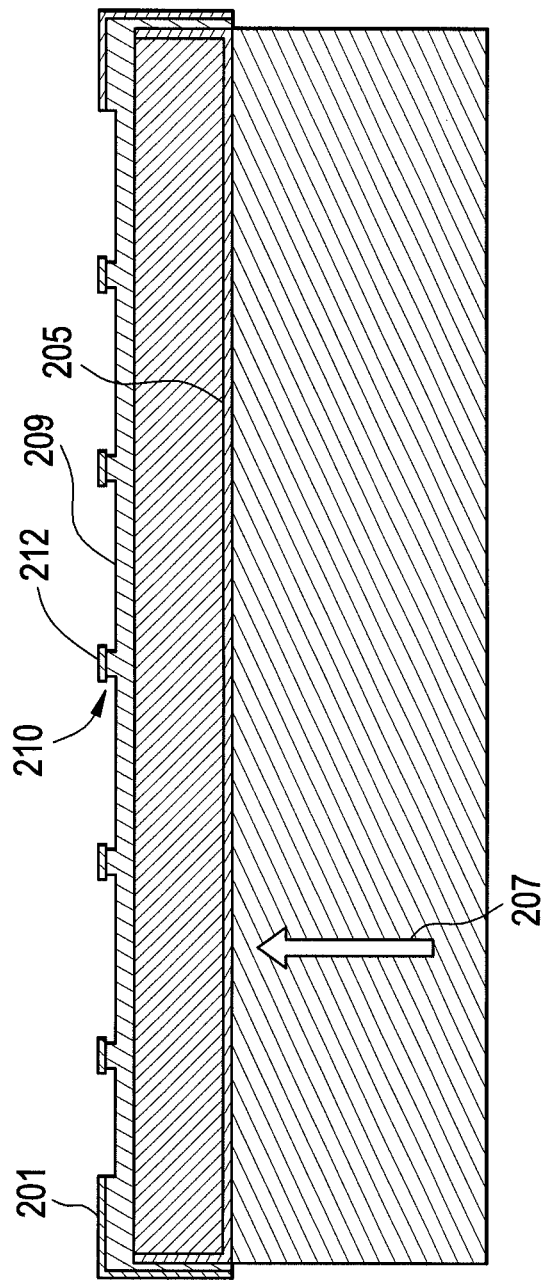
FIG. 2 is a diagram of an electrostatic chuck including a conductive coating on the workpiece-contacting surface of one or more embossments, in accordance with an embodiment of the invention.

FIG. 2 is a diagram of an electrostatic chuck including a conductive coating 212 on the workpiece-contacting surface of one or more embossments 210, in accordance with an embodiment of the invention. In this embodiment, a conductive coating 212 such as diamond like carbon, on the top of the embossments 210 helps with wear resistance, for example when the chuck is used with a solar panel or other substrate in which precise alignment of the substrate requires that the substrate slide into position across the surface of the chuck. In such a case, the conductive coating 212, such as diamond like carbon, may help by having a low coefficient of friction relative to the substrate. The embodiment of FIG. 2 may be fabricated by making a duplex coating (i.e., a coating made of two materials, one on top of the other) out of the material for the main field area 209, such as silicon carbide, covered by a conductive coating such as diamond like carbon 212, and then etching away material to form the coated embossments 210/212.

In accordance with the embodiment of FIG. 2, the electrostatic chuck includes the duplex coating structure 210/212 on the electrostatic chuck surface, and a back side conductive grounding layer 205. The main field area 209 may be formed of a thinner material than an otherwise similar electrostatic chuck without the duplex coating, for example by being made of silicon carbide that is about 1.5 microns thinner than an otherwise similar electrostatic chuck, and with a surface resistivity of about $2 \times 10^{10}$ ohms per square. In a similar fashion to the embodiment of FIG. 1, a conductive path 201 may be used, for example made of diamond like carbon with a thickness of about 1.5 microns and a surface resistivity of about $10^7$ ohms per square. A slightly higher surface resistivity of about $10^8$ ohms per square may work without impacting the clamp force of the electrostatic chuck. The electrostatic chuck may be grounded using a grounding pin 207 in the base of the electrostatic chuck. As used herein, it will be appreciated that a grounding screw or other similar grounding structure may be used in place of a grounding pin.

Figure 3:
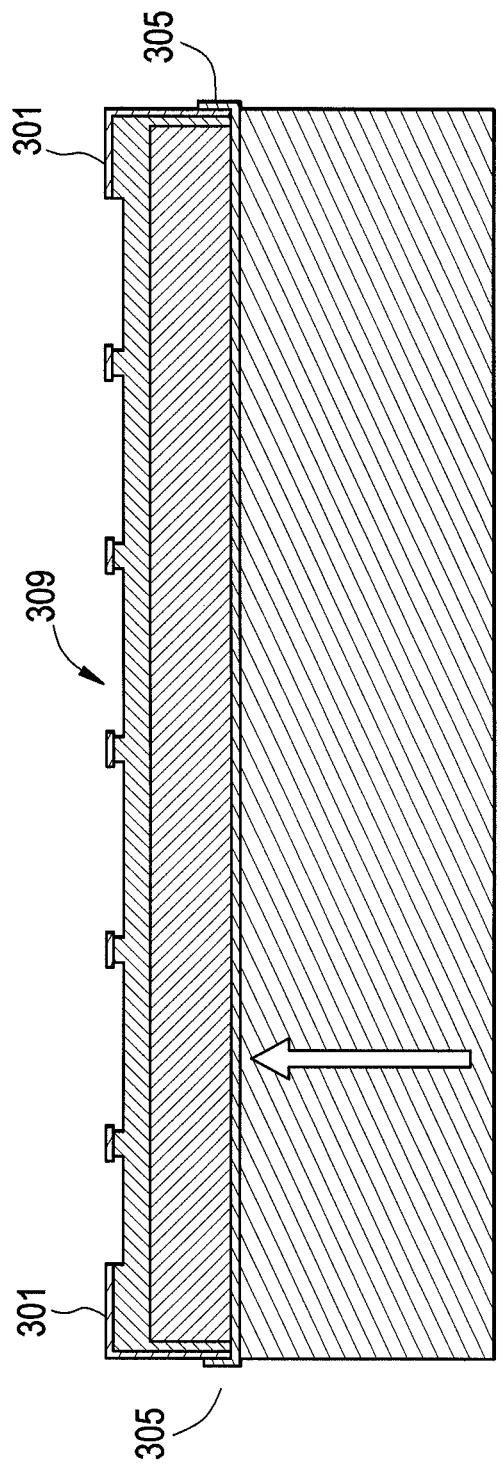
FIG. 3 is a diagram of an alternative version of the electrostatic chuck of FIG. 2, in which a conductive grounding layer is positioned outside a conductive path around the edge of the electrostatic chuck, in accordance with an embodiment of the invention.

FIG. 3 is a diagram of an alternative version of the electrostatic chuck of FIG. 2, in which a conductive grounding layer 305 is positioned outside a conductive path 301 around the edge of the electrostatic chuck, in accordance with an embodiment of the invention. Such an arrangement may reduce the surface resistivity through the edge of the platen as compared with that of FIG. 2. Alternatively, the arrangement of FIG. 2, in which the conductive grounding layer is positioned inside the conductive path, may be preferable in order to reduce metals contamination on the workpiece. In determining a distance up the edge of the electrostatic chuck to which the conductive grounding layer 305 extends, there is a balance between the goal of keeping metal contamination away from the workpiece, which encourages use of a shorter conductive grounding layer 305, versus the desire to improve the conductivity of the path 301, which encourages use of a longer conductive grounding layer 305. In the embodiment of FIG. 3, as in other embodiments herein, a surface resistivity of between about $10^9$ and about $10^{11}$ ohms per square may be used for the main field area 309; between about $10^5$ and about $10^7$ ohms per square for the conductive path 301, such as a diamond like carbon coating; and less than about $10^3$ ohms per square for the conductive grounding layer 305, such as an aluminum layer.

Figure 4:
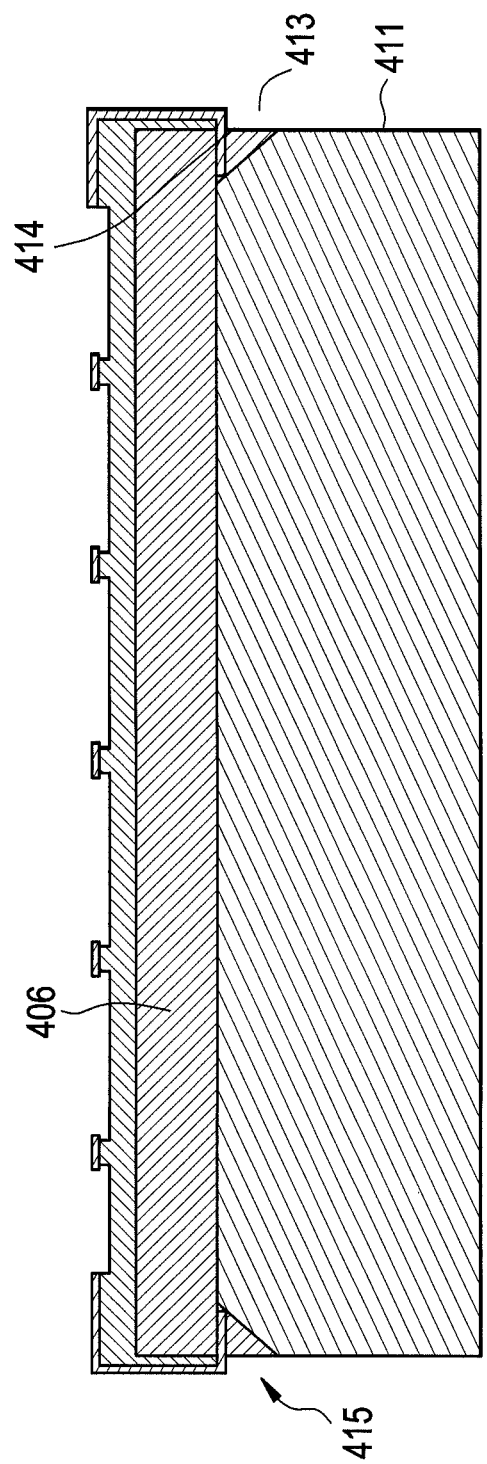
FIG. 4 is a diagram of an electrostatic chuck in which electrically conductive epoxy is used to form an electrical connection, in accordance with an embodiment of the invention.

FIG. 4 is a diagram of an electrostatic chuck in which electrically conductive epoxy is used to form an electrical connection, in accordance with an embodiment of the invention. In this embodiment, similar techniques to those of FIG. 2 may be used, except that the base 411 is chamfered on one or more edges 413 and an electrical connection is made in the chamfered area 414 using an electrically conductive epoxy, such as graphite conductive epoxy. In addition, the conductive path 401, such as a diamond like carbon coating, may wrap to the back of the electrostatic chuck, underneath the ceramic insulator layer 406, as at 415. In addition, a grounding screw, grounding pin or other similar grounding structure may be used.

Figure 5:
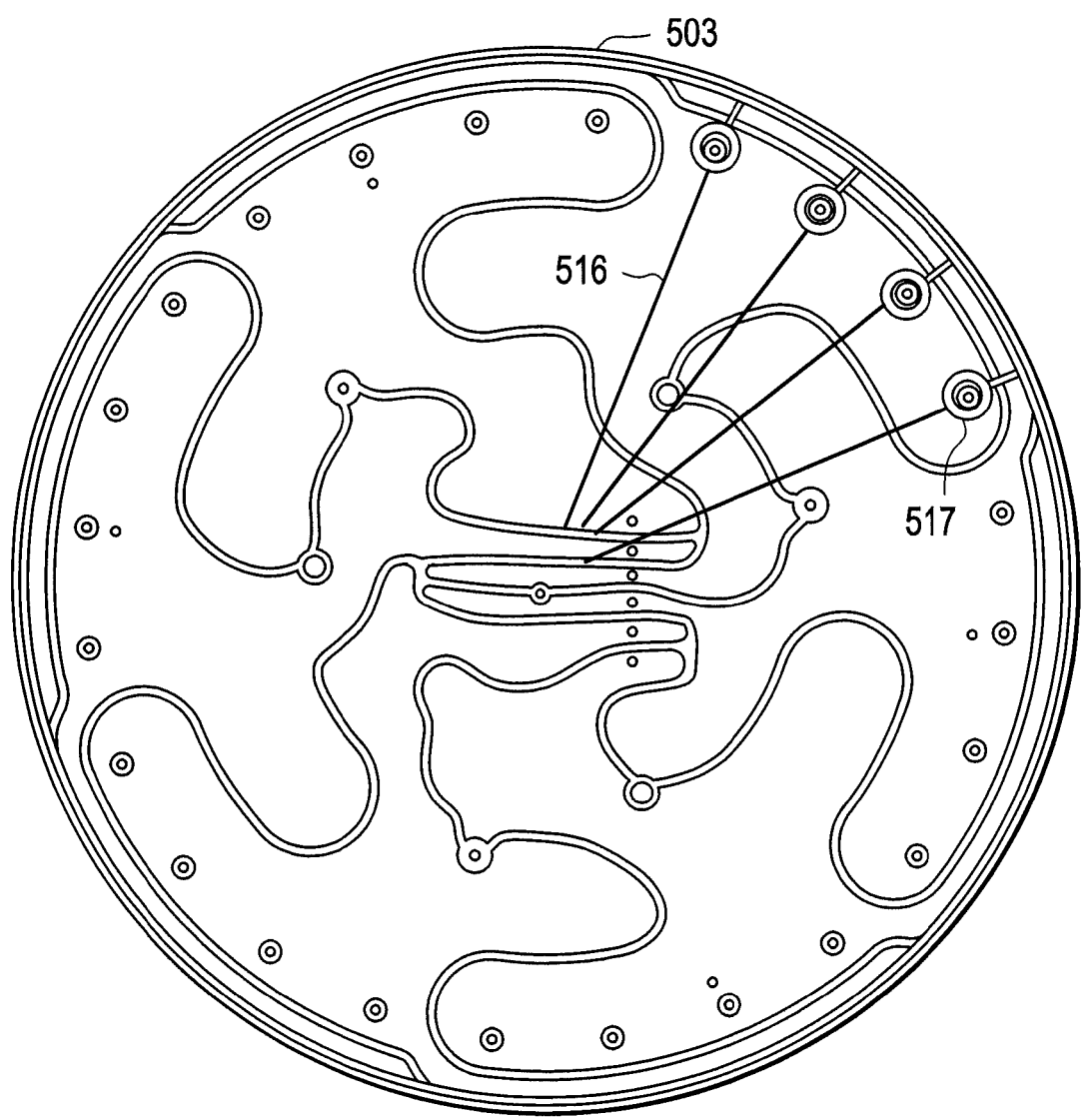
FIG. 5 is a diagram of an electrostatic chuck including conductive patterns on the workpiece-contacting surface of the electrostatic chuck, in accordance with an embodiment of the invention.

FIG. 5 is a diagram of an electrostatic chuck including conductive patterns on the workpiece-contacting surface of the electrostatic chuck, in accordance with an embodiment of the invention. The conductive patterns may electrically contact the conductive path 101 (see FIG. 1), and may, for example, include high conductivity spokes 516 from the center of the electrostatic chuck face to the edge of the chuck. Such conductive patterns may provide a high conductivity path to ground, and may facilitate charge mobility over the surface of the chuck and to ground. The spokes 516 may, for example, be made of a conductive coating such as DLC, aluminum or another high conductivity material. For example, the conductive patterns may be made of metal, such as aluminum, coated with a conductive coating, such as DLC, in order to avoid metals contamination to the workpiece. Further, the conductive patterns may be formed of a metal coated with the material used for the rest of the main field area (see 109 of FIG. 1), such as silicon carbide. In one embodiment, conductive patterns may be formed of aluminum deposited to a thickness of 1000 Angstroms, coated with hydrogenated carbon doped with nitrogen. The conductive patterns may also, for example, include rings 517 around the gas holes of the electrostatic chuck and on the gas seal ring 503. Conductive patterns such as spokes 516 may take curved paths in order to avoid features such as embossments on the electrostatic chuck surface. In a further embodiment, small tracelike pathways of highly conductive material may be formed leading between embossments of the electrostatic chuck and ultimately to ground, as well as using highly conductive material on the top of the embossments. Conductive patterns may be designed to minimize total path area, in order to minimize the theft of clamp force produced by the parasitic effect of such paths.

Figure 6:
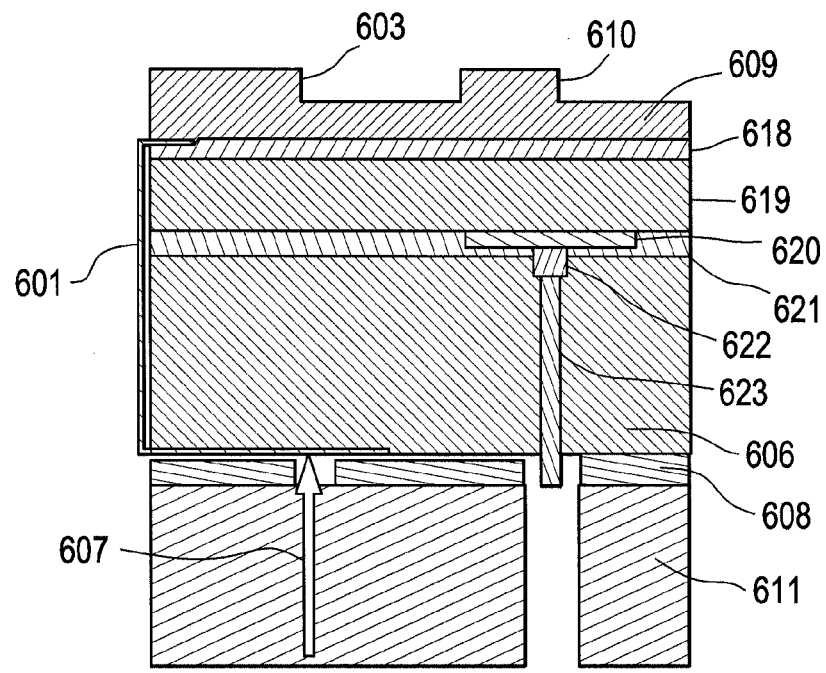
FIG. 6 is a diagram of a polymer-surfaced electrostatic chuck providing a path to ground for charge, in accordance with an embodiment of the invention, in which the surface includes a carbon nanotube filled polymer.

FIG. 6 is a diagram of a polymer-surfaced electrostatic chuck providing a path to ground for charge, in accordance with an embodiment of the invention, in which the surface includes a carbon nanotube filled polymer. Polymer-surface electrostatic chucks can provide excellent particle-production performance by having excellent contact between the polymer surface and the workpiece. In accordance with an embodiment of the invention, such polymer-surface electrostatic chucks are provided with the ability to move charge from the chuck surface, and the workpiece, to ground, while maintaining the polymer/workpiece contact, avoiding metals contamination issues and permitting the electrostatic chuck surface to be refurbished. In accordance with an embodiment of the invention, a polymer-surfaced electrostatic chuck is provided with a surface resistivity of from about $10^8$ to about $10^{10}$ ohms per square in the main field area of the chuck surface, and a surface resistivity of from about $10^5$ to about $10^7$ ohms per square at the gas seal area, as well as a highly conductive path to ground from the edge of the chuck, for example less than about $10^4$ ohms.

In the embodiment of FIG. 6, the surface of the electrostatic chuck includes a carbon nanotube filled polymer, which forms a blanket layer 609 and embossments 610. The polymer surface 609/610 is grounded by a conductive path 601, which may extend from just under the blanket layer 609, around the edge of the electrostatic chuck, and underneath an alumina insulator layer 606. The conductive path 601 may, for example, be formed of an aluminum coating formed by physical vapor deposition (PVD) or another conductive coating such as diamond like carbon, for example hydrogenated carbon doped with nitrogen. A grounding screw 607 may electrically connect the conductive path 601 to an aluminum base/cooling structure 611. The electrostatic chuck also includes a gas seal ring 603, an electrically conductive epoxy layer 608, an adhesion coating 618, an alumina dielectric 619, a metal electrode 620, a fluorinated polymer bond 621 (such as a perfluoroalkoxy (PFA) bond), an electrically conductive epoxy bond 622 and an electrode pin 623. The adhesion coating layer may comprise at least one of silicon containing nitrides, oxides, carbides and non-stoichiometric versions of these, for example but not limited to $SiO_xN_y$, silicon nitride, silicon oxide or silicon carbide. The adhesion coating layer may also comprise carbon or a nitride compound of carbon; and may comprise diamond-like carbon. The polymer surface 609/610 may, for example, be a carbon nanotube filled polymer such as carbon nanotube filled polyether imide (PEI), polyether ether ketone (PEEK) or polyimide. The surface resistivity of the carbon nanotube surface 609/610 may, for example, be in the range of from about $10^8$ to about $10^{10}$ ohms per square. The carbon nanotube surface 609/610 may, for example, be formed by lamination and patterning by reactive ion etch, in a similar way to that described in Published PCT Application WO 2010/132640 A2 of Entegris, Inc., entitled "Electrostatic Chuck with Polymer Protrusions," the entire disclosure of which is hereby incorporated herein by reference. An advantage of the carbon nanotube filled polymer surface of the embodiment of FIG. 6 may be that the resistivity is uniform throughout the material, and will not wear off or wear out with time or with cleaning.

Figure 7:
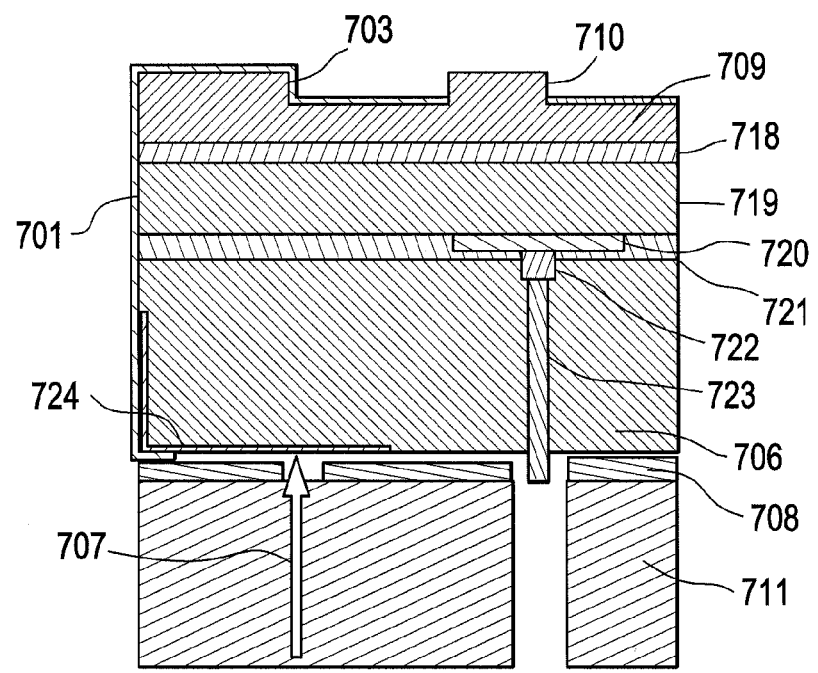
FIG. 7 is a diagram of a polymer-surfaced electrostatic chuck providing a path to ground for charge, in accordance with an embodiment of the invention, in which the path to ground is provided by a conductive coating blanket film with gas seal contact.

FIG. 7 is a diagram of a polymer-surfaced electrostatic chuck providing a path to ground for charge, in accordance with an embodiment of the invention, in which the path to ground is provided by a conductive coating blanket film with gas seal contact. In the embodiment of FIG. 7, the surface of the electrostatic chuck includes a polymer, which forms a blanket layer 709 and embossments 710. The polymer surface 709/710 is grounded by a conductive path 701, which may be present in the field area between embossments 710, over the gas seal ring 703 and around the edge of the electrostatic chuck, and underneath an alumina insulator layer 706. The conductive path 701 may, for example, be formed of a conductive coating such as diamond like carbon, for example hydrogenated carbon doped with nitrogen. In addition, the conductive path 701 may be electrically connected to ground by a further coating path 724, such as an aluminum coating formed by physical vapor deposition (PVD). A grounding screw 707 may electrically connect the coating path 724 to an aluminum base/cooling structure 711. The electrostatic chuck also includes a gas seal ring 703, an alumina insulator layer 706, an electrically conductive epoxy layer 708, an adhesion coating 718, an alumina dielectric 719, a metal electrode 720, a ceramic to ceramic bond 721, an electrically conductive epoxy bond 722 and an electrode pin 723. The adhesion coating layer may comprise similar materials to those for the embodiment of FIG. 6. The polymer surface 709/710 may, for example, be a polymer such as polyether imide (PEI), polyether ether ketone (PEEK) or polyimide. The surface resistivity of the polymer surface 709/710 may, for example, be in the range of from about $10^8$ to about $10^{10}$ ohms per square. The polymer surface 709/710 may, for example, be formed by lamination and patterning by reactive ion etch, in a similar way to that described in Published PCT Application WO 2010/132640 A2 of Entegris, Inc., entitled "Electrostatic Chuck with Polymer Protrusions," the entire disclosure of which is hereby incorporated herein by reference.

Advantages of the embodiment of FIG. 7 may be that polymer/workpiece contact is maintained on the embossments 710; a conductive path to ground is provided for charge in the middle of the chuck, using the non-workpiece-contact field area; and the robust coating should survive cleaning operations.

Figure 8:
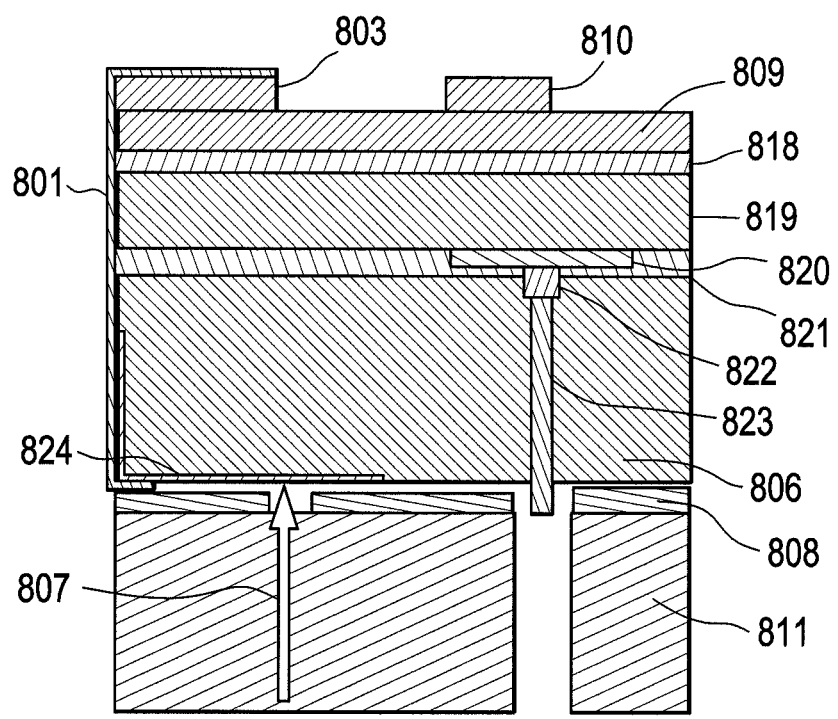
FIG. 8 is a diagram of a polymer-surfaced electrostatic chuck providing a path to ground for charge, in accordance with an embodiment of the invention, in which the path to ground is provided by a conductive coating with gas seal contact.

FIG. 8 is a diagram of a polymer-surfaced electrostatic chuck providing a path to ground for charge, in accordance with an embodiment of the invention, in which the path to ground is provided by a conductive coating with gas seal contact. In the embodiment of FIG. 8, in a similar fashion to that of FIG. 7, the surface of the electrostatic chuck includes a polymer, which forms a blanket layer 809 and embossments 810. The polymer surface 809/810 is grounded by a conductive path 801, which extends over the gas seal ring 803 and around the edge of the electrostatic chuck, and underneath an alumina insulator layer 806. The conductive path 801 may, for example, be formed of a conductive coating such as diamond like carbon, for example hydrogenated carbon doped with nitrogen. In addition, the conductive path 801 may be electrically connected to ground by a further coating path 824, such as an aluminum coating formed by physical vapor deposition (PVD). A grounding screw 807 may electrically connect the coating path 824 to an aluminum base/cooling structure 811. The electrostatic chuck also includes a gas seal ring 803, an alumina insulator layer 806, an electrically conductive epoxy layer 808, an adhesion coating 818, an alumina dielectric 819, a metal electrode 820, a fluorinated polymer bond 821 (such as a perfluoroalkoxy (PFA) bond), an electrically conductive epoxy bond 822 and an electrode pin 823. The adhesion coating layer may comprise similar materials to those given for the embodiment of FIG. 7. The polymer surface 809/810 may, for example, be a polymer such as polyether imide (PEI), polyether ether ketone (PEEK) or polyimide. The surface resistivity of the polymer surface 809/810 may, for example, be in the range of from about $10^8$ to about $10^{10}$ ohms per square. The polymer surface 809/810 may, for example, be formed by lamination and patterning by reactive ion etch, in a similar way to that described in Published PCT Application WO 2010/132640 A2 of Entegris, Inc., entitled "Electrostatic Chuck with Polymer Protrusions," the entire disclosure of which is hereby incorporated herein by reference.

Advantages of the embodiment of FIG. 8 may be that polymer/workpiece contact is maintained on the embossments 810; the manufacturing process is simpler than that of the embodiment of FIG. 7 since no coating is added in the area surrounding the embossments; a conductive path to ground is provided from the edge of the chuck; and the robust coating should survive cleaning operations.

Figure 9:
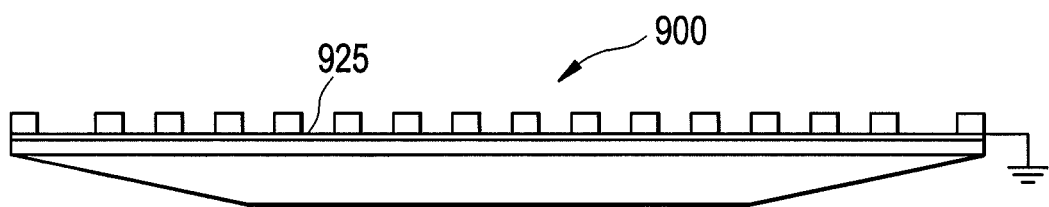
FIG. 9 is a diagram of an electrostatic chuck in accordance with an embodiment of the invention, in which an underlying conductive layer is used.

FIG. 9 is a diagram of an electrostatic chuck 900 in accordance with an embodiment of the invention, in which an underlying conductive layer 925 is used. The conductive layer 925 may be fabricated of a conductive material which may include, but not be limited to, a diamond like carbon (DLC) or aluminum. The surface resistivity of the conductive layer 925 may be in the range of from about $10^9$ to about $10^{11}$ ohms per square. The large surface area of the conductive layer 925 (96-98%) provides a sufficient path for electrical charge dissipation through either an electrical via, or by wrapping the conductive layer around the sides of the platen to a grounded base of the platen.

Electrostatic charge that may accumulate on the platen surface can be a significant factor contributing to workpiece "sticking" problems. Such electrostatic charging on the platen surface can be controlled and dissipated by the conductive layer 925. The conductive layer 925 may also facilitate electrical charge transfer between the workpiece and ground. In addition, since the conductive layer 925 does not contact the backside of the workpiece in a clamped position, any wear of the conductive layer 925 due to contact friction may be avoided.

Figure 10:
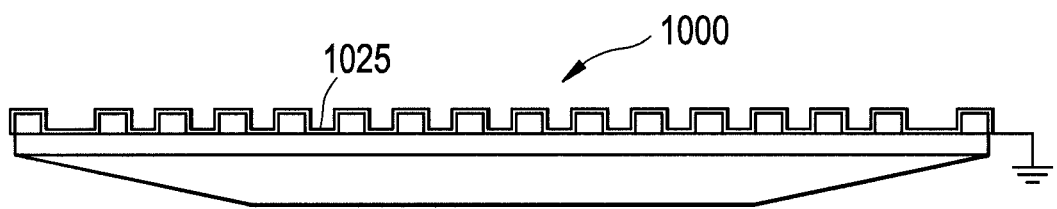
FIG. 10 is a diagram of an electrostatic chuck in accordance with an embodiment of the invention, in which a blanket layer is used.

FIG. 10 is a diagram of an electrostatic chuck 1000 in accordance with an embodiment of the invention, in which a blanket layer 1025 is used. Compared to the embodiment of FIG. 9, the conductive layer 1025 is deposited as a "blanket" layer over the gas seal ring and the embossments. The electrical connection to ground may be similar to that of FIG. 9. The surface resistivity of the conductive layer 1025 may also be in the range of from about $10^9$ to about $10^{11}$ ohms per square. With the top surface of the embossments electrically conductive, charges can be transferred across the entire workpiece into the general regions between embossments and dissipated to ground. In addition, low resistance paths, e.g., channels, may be incorporated into the platen structure to control draining the wafer electrical charge and platen surface charge to ground via the platen base. The conductive path may be made through the thickness of the electrostatic components using a conductive via or channel attached to ground.

By providing highly conductive paths to ground, an embodiment according to the invention permits charge to bleed out of the electrostatic chuck in a sufficiently short space of time given the pace of substrate processing by the electrostatic chuck, to prevent or mitigate wafer sticking or other wafer handling problems. In this regard, it should be noted that the surface resistivity of the conductive path to ground in accordance with an embodiment of the invention should be sufficient to deliver charge to ground in the time that is permitted by a process in which the electrostatic chuck is being used. For example, a processing time of 10 seconds per workpiece versus a processing time of 1 second per workpiece will require an order of magnitude difference in surface resistivity in order to deliver charge to ground in the requisite amount of time. For implant processes, cycle times in the tenths of seconds require the surface resistivities set forth herein, although other surface resistivities may be used as necessary.

In accordance with an embodiment of the invention, a conductive path to ground is provided for an electrostatic chuck, which permits the bleeding of charge to ground, while also avoiding excessive parasitic effects in which the conductive path itself could reduce the clamping force of the electrostatic chuck. Although some parasitic effect may be produced, it is not believed to significantly reduce clamping force, for example where a conductive path, such as a DLC coating, is only present at the edge of the chuck.

As used herein, the term "workpiece-contacting surface" means a surface that contacts a workpiece, which is clamped by an electrostatic chuck, during use of the electrostatic chuck.

An embodiment according to the invention may be used with Coulombic chucks and Johnsen-Rahbek chucks. Further, where conductive coatings are described herein, it will be appreciated that a variety of different possible conductive materials may be used; for example, doped silicon carbide, a metal such as aluminum or another material may be used in place of diamond like carbon. Polishing may be used to reduce effective surface resistivities of conductive paths. In one embodiment, a duplex structure may be formed of silicon carbide, for a main field area of the electrostatic chuck, in combination with highly doped silicon carbide for conductive paths. Electrostatic chucks according to an embodiment of the invention may be refurbished, for example using a reactive ion etch process. Further, an embodiment according to the invention may be used in differing systems including, but not limited to, beam line ion implanters, plasma doping ion implanters, plasma immersion ion implantation systems, flood ion implanters, focused plasma systems, systems that modulate a plasma sheath, etching systems, optical based processing systems and chemical vapor deposition systems.

The teachings of all patents, published applications and references cited herein are incorporated by reference in their entirety.

While this invention has been particularly shown and described with references to example embodiments thereof, it will be understood by those skilled in the art that various changes in form and details may be made therein without departing from the scope of the invention encompassed by the appended claims.

What is claimed is:

1. An electrostatic chuck, comprising:
   a conductive path covering at least a portion of a workpiece-contacting surface of a gas seal ring of the electrostatic chuck, the conductive path comprising a coating covering at least a portion of an outside edge of the gas seal ring and at least a portion of an outside edge of the electrostatic chuck and comprising at least a portion of an electrical path to ground, the conductive path comprising a surface resistivity in the range of from about $10^5$ ohms per square to about $10^7$ ohms per square; and
   a main field area of a workpiece-contacting surface of the electrostatic chuck comprising a surface resistivity in the range of from about $10^8$ to about $10^{12}$ ohms per square, the main field area comprising at least one embossment extending above surrounding portions of the main field area; and
   a conductive coating on a workpiece-contacting surface of the at least one embossment.

2. An electrostatic chuck according to claim 1, wherein the conductive path comprises diamond-like carbon.

3. An electrostatic chuck according to claim 2, wherein the conductive path comprises doped diamond-like carbon.

4. An electrostatic chuck according to claim 3, wherein the conductive path comprises hydrogenated carbon doped with nitrogen.

5. An electrostatic chuck according to claim 1, wherein the conductive path comprises a coating of a thickness less than about 1 micron.

6. An electrostatic chuck according to claim 1, wherein the conductive path wraps underneath an insulator layer of the electrostatic chuck.

7. An electrostatic chuck according to claim 1, wherein the main field area comprises silicon carbide.

8. An electrostatic chuck according to claim 7, wherein the main field area comprises a surface resistivity in the range of from about $10^9$ to about $10^{11}$ ohms per square.

9. An electrostatic chuck according to claim 1, wherein the electrostatic chuck comprises a conductive grounding layer, at least a portion of which is underneath an insulator layer of the electrostatic chuck, the conductive grounding layer electrically contacting the conductive path.

10. An electrostatic chuck according to claim 9, wherein at least a portion of an outside edge of the conductive grounding layer is covered by the conductive path.

11. An electrostatic chuck according to claim 9, wherein the conductive grounding layer electrically contacts a grounding pin of the electrostatic chuck.

12. An electrostatic chuck according to claim 9, further comprising an electrically conductive epoxy layer underlying at least a portion of the conductive grounding layer.

13. An electrostatic chuck according to claim 1, wherein the conductive path of the electrostatic chuck and the conductive coating on the workpiece-contacting surface of the at least one embossment each comprise a diamond like carbon coating.

14. An electrostatic chuck according to claim 1, wherein a base of the electrostatic chuck comprises a chamfered area on one or more edges of the base.

15. An electrostatic chuck according to claim 14, wherein the conductive path electrically contacts the base through a conductive epoxy in the chamfered area.

16. An electrostatic chuck according to claim 15, wherein the conductive path comprises a coating covering at least a portion of an outside edge of the electrostatic chuck, the conductive path wrapping underneath an insulator layer of the electrostatic chuck.

17. An electrostatic chuck according to claim 1, further comprising at least one conductive pattern on the workpiece-contacting surface of the electrostatic chuck, the at least one conductive pattern electrically contacting the conductive path.

18. An electrostatic chuck according to claim 17, wherein the at least one conductive pattern comprises a metal coated with a conductive coating.

19. An electrostatic chuck according to claim 17, wherein the at least one conductive pattern comprises at least one of: a spoke extending towards the center of the electrostatic chuck; a ring around a gas hole of the electrostatic chuck; and a trace between two embossments on the workpiece-contacting surface of the electrostatic chuck.

20. An electrostatic chuck according to claim 1, wherein the main field area of the electrostatic chuck comprises a polymer.

21. An electrostatic chuck according to claim 20, wherein the main field area comprises at least one embossment extending above surrounding portions of the main field area, the at least one embossment comprising a polymer.

22. An electrostatic chuck according to claim 20, wherein the main field area comprises a surface resistivity in the range of from about $10^8$ to about $10^{10}$ ohms per square.

23. An electrostatic chuck according to claim 20, wherein the conductive path comprises a conductive coating, the conductive coating also covering at least a portion of the main field area.

24. An electrostatic chuck, comprising:
   a conductive path electrically connected to at least a portion of a workpiece-contacting surface of the electrostatic chuck, the conductive path comprising a coating covering at least a portion of an outside edge of the electrostatic chuck and comprising at least a portion of an electrical path to ground; and
   a main field area of a workpiece-contacting surface of the electrostatic chuck comprising a surface resistivity in the range of from about $10^8$ to about $10^{10}$ ohms per square, the main field area comprising a blanket layer and at least one embossment extending above surrounding portions of the main field area, the blanket layer and the at least one embossment each comprising a polymer comprising carbon nanotubes;

the conductive path further comprising a portion extending from under the blanket layer to the coating covering the at least a portion of the outside edge of the electrostatic chuck; and a conductive coating on a workpiece-contacting surface of the at least one embossment.

25. An electrostatic chuck according to claim 24, wherein the polymer comprises at least one of: carbon nanotube filled polyether imide; carbon nanotube filled polyether ether ketone; and carbon nanotube filled polyimide.

* * * * *